US010678377B2

(12) United States Patent
Wu et al.

(10) Patent No.: US 10,678,377 B2
(45) Date of Patent: Jun. 9, 2020

(54) SENSOR AND DISPLAY DEVICE

(71) Applicant: BOE TECHNOLOGY GROUP CO., LTD., Beijing (CN)

(72) Inventors: Chunwei Wu, Beijing (CN); Xue Dong, Beijing (CN); Haisheng Wang, Beijing (CN); Xiaoliang Ding, Beijing (CN); Yingming Liu, Beijing (CN); Pengpeng Wang, Beijing (CN); Yanling Han, Beijing (CN); Wei Liu, Beijing (CN); Rui Xu, Beijing (CN); Lijun Zhao, Beijing (CN); Yuzhen Guo, Beijing (CN); Changfeng Li, Beijing (CN); Yanan Jia, Beijing (CN); Jing Lv, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 40 days.

(21) Appl. No.: 15/752,073

(22) PCT Filed: Jul. 28, 2017

(86) PCT No.: PCT/CN2017/094903
§ 371 (c)(1),
(2) Date: Feb. 12, 2018

(87) PCT Pub. No.: WO2018/024161
PCT Pub. Date: Feb. 8, 2018

(65) Prior Publication Data
US 2018/0239454 A1    Aug. 23, 2018

(30) Foreign Application Priority Data

Aug. 4, 2016    (CN) .......................... 2016 1 0632936

(51) Int. Cl.
*G06F 3/042*    (2006.01)
*G06F 3/041*    (2006.01)
*G06F 3/047*    (2006.01)

(52) U.S. Cl.
CPC .............. *G06F 3/042* (2013.01); *G06F 3/047* (2013.01); *G06F 3/0416* (2013.01);
(Continued)

(58) Field of Classification Search
CPC ...... G06F 3/042; G06F 3/0416; G06F 3/0421; G06F 3/047; G06F 2203/04101; H01L 2224/73265
(Continued)

(56) References Cited

U.S. PATENT DOCUMENTS

2009/0200088 A1*  8/2009 Chuang ................. G06F 3/0412
178/18.01
2012/0320170 A1   12/2012 Lee et al.
(Continued)

FOREIGN PATENT DOCUMENTS

CN    101487938 A    7/2009
CN    101739177 A    6/2010
(Continued)

OTHER PUBLICATIONS

International search report dated Nov. 9, 2017 for corresponding application No. PCT/CN20171094903 with English translation attached.
(Continued)

*Primary Examiner* — Amare Mengistu
*Assistant Examiner* — Gloryvid Figueroa-Gibson
(74) *Attorney, Agent, or Firm* — Nath, Goldberg & Meyer; Joshua B. Goldberg

(57) ABSTRACT

The present application provides a sensor comprising a grating and a sensor array sequentially disposed in a thickness direction of the sensor, wherein the sensor array comprises a plurality of photosensitive sensor units, and light passing through a light transmission gap of the grating reaches the plurality of photosensitive sensor units. The present application further provides a display device com-
(Continued)

prising the sensor. The sensor may detect three-dimensional coordinates of an object so that the display device can realize three-dimensional touch control.

14 Claims, 2 Drawing Sheets

(52) U.S. Cl.
CPC .. *G06F 3/0421* (2013.01); *G06F 2203/04101* (2013.01); *H01L 2224/73265* (2013.01)

(58) Field of Classification Search
USPC .......................................................... 345/173
See application file for complete search history.

(56) References Cited

U.S. PATENT DOCUMENTS

| 2014/0340302 | A1 | 11/2014 | Sengupta et al. | |
|---|---|---|---|---|
| 2017/0078513 | A1* | 3/2017 | Chang | G06F 3/0488 |

FOREIGN PATENT DOCUMENTS

| CN | 101751187 A | 6/2010 |
|---|---|---|
| CN | 102520826 A | 6/2012 |
| CN | 106066742 A | 11/2016 |
| CN | 206058159 U | 3/2017 |
| KR | 20110129664 A | 12/2011 |
| KR | 20120070978 A | 7/2012 |

OTHER PUBLICATIONS

International corrected form PCT-ISA-237 dated Dec. 27, 2017 for corresponding application No. PCT/CN2017/094903.
Chinese office action dated May 30, 2018 for corresponding application No. 201610632936.5 with English translation attached.

* cited by examiner

SENSOR AND DISPLAY DEVICE

CROSS-REFERENCE TO RELATED APPLICATIONS

This is a National Phase application filed under 35 U.S.C. 371 as a national stage of PCT/CN2017/094903, filed on Jul. 28, 2017, an application claiming the benefit of Chinese Application No. 201610632936.5, filed on Aug. 4, 2016, the content of each of which is hereby incorporated by reference in its entirety.

TECHNICAL FIELD

The present disclosure relates to the field of display devices, and particularly relates to a sensor and a display device including the same.

BACKGROUND

In order to facilitate human-computer interaction, a touch display device has been developed. When an operator's finger touches a display surface of the touch display device, a coordinate of the touch point can be determined. However, at present, only the coordinate of the touch point on the two-dimensional plane can be determined, but coordinates of the touch point in the three-dimensional space cannot be determined and thus other functions such as three-dimensional touch control cannot be realized.

Therefore, how to determine the coordinate of the touch point in the three-dimensional space has become a technical problem to be solved urgently in the art.

SUMMARY

According to an embodiment of the present disclosure, there is provided a sensor and a display device including the sensor. The sensor is capable of determining coordinates of a touch point in a three-dimensional space.

As an aspect of the present disclosure, there is provided a sensor which includes a grating and a sensor array sequentially disposed in a thickness direction of the sensor, wherein the sensor array includes a plurality of photosensitive sensor units and light can passing through a light transmission gap of the grating reaches the plurality of photosensitive sensor units. The sensor further includes a distance calculator configured to determine a distance between an object to be detected and a light incident surface of the sensor based on a position of a photosensitive sensor unit of the plurality of photosensitive sensor units that has received the light from the object.

The sensor further includes a coordinate calculator configured to determine a coordinate of the object on the light incident surface of the sensor based on the position of the photosensitive sensor unit that has received the light from the object.

Optionally, the sensor further includes a transparent substrate. The grating is disposed on one side of the transparent substrate, and the sensor array is disposed on the other side of the transparent substrate.

Optionally, the sensor further includes a spectrum generator configured to generate a curve of amount of light sensed by the photosensitive sensor units in the sensor array, and the distance calculator is configured to calculate a distance between the object to be detected and the sensor based on a width of the light transmission gap of the grating and a distance between two adjacent peaks of the curve of the amount of light sensed by the photosensitive sensor units.

Optionally, the grating includes a first substrate and a second substrate arranged opposite to and aligned with each other, a liquid crystal material layer filled between the first substrate and the second substrate, a first transparent electrode layer, a second transparent electrode layer and a controller. The first transparent electrode layer is disposed on the first substrate, and the second transparent electrode layer is disposed on the second substrate. The first transparent electrode layer includes a plurality of first transparent electrodes. The controller is configured to provide different control signals to the second transparent electrode layer and part of the first transparent electrodes of the first transparent electrode layer, respectively. When the first transparent electrodes and the second transparent electrode layer receive different control signals, respectively, an electric field for deflecting liquid crystal molecules is formed between the first transparent electrodes and the second transparent electrode layer, so as to form a plurality of spaced opaque regions in the liquid crystal material layer.

Optionally, the first transparent electrode is a strip-shaped electrode, and the plurality of spaced opaque regions are provided as opaque grating strips of the grating.

Optionally, the plurality of the first transparent electrodes are arranged in a plurality of rows and a plurality of columns on the first substrate. Optionally, the plurality of the first transparent electrodes are a plurality of rectangular electrodes arranged in a matrix on the first substrate.

In a case where the distance between two adjacent peaks of the curve of the amount of light sensed by the photosensitive sensor units is less than a first preset value, the controller is configured to change the first transparent electrode receiving the control signal so that the distance between two adjacent opaque regions is larger than it was before until the distance between the two adjacent peaks of the curve of the amount of light sensed by the photosensitive sensor units reaches the first preset value.

In a case where the distance between two adjacent peaks of the curve of the amount of light sensed by the photosensitive sensor units is greater than a second preset value, the controller is configured to change a position of the first transparent electrode receiving the control signal so that the distance between two adjacent opaque regions is smaller than it was before until the distance between the two adjacent peaks of the curve of the amount of light sensed by the photosensitive sensor units reaches the second preset value.

Optionally, each of the photosensitive sensor units is configured to sense visible light. The sensor further includes a visible light source disposed on a side of the sensor array facing away from the grating.

Optionally, each of the photosensitive sensor units is configured to sense infrared light. Optionally, the sensor further includes an infrared light source disposed on a side of the sensor array facing away from the grating. Optionally, the sensor array includes a plurality of touch driving lines and a plurality of touch sensing lines, wherein the plurality of touch driving lines and the plurality of touch sensing lines intersect with each other and define a plurality of sensing units, each of the sensing units being provided with one of the photosensitive sensor units which has an input terminal connected to the touch driving line and an output terminal connected to the touch sensing line.

Optionally, each of the photosensitive sensor units includes a phototransistor, an output transistor and a capacitor. A first electrode and a gate electrode of the phototransistor and a first end of the capacitor are connected to the touch driving line corresponding to the photosensitive sensor units in a current row; a second electrode of the phototransistor is connected to a second end of the capacitor and a first electrode of the output transistor; a gate electrode of the output transistor is connected to the touch driving line corresponding to the photosensitive sensor units in a previous row; and a second electrode of the output transistor is connected to the touch sensing line corresponding to the photosensitive sensor units in a current column.

Optionally, the coordinates of the object may be determined based on the amount of light sensed by the phototransistor in which leakage current occurs due to irradiation of external light and a position of the phototransistor.

Optionally, an active layer of the phototransistor is made of an amorphous silicon material, and an active layer of the output transistor is made of an oxide.

As another aspect of the present disclosure, there is provided a display device including a display panel and a sensor, wherein the sensor is the sensor above-mentioned, and a surface of the grating facing away from the sensor array and a light-exiting surface of the display panel are facing toward a same direction.

Optionally, in a case where the sensor array includes a plurality of touch driving lines and a plurality of touch sensing lines, the touch driving lines further serve as gate lines of the display panel.

When there is an object on the light incident side of the sensor, the light environment on the light incident side of the sensor becomes changed, and the object reflects the light toward the grating. Therefore, the sensor can detect whether there is an object on the light incident side of the sensor.

Since there is provided the grating with a light transmission gap, when light from the object is irradiated toward the surface of the sensor provided with the grating, the shielding portion of the grating guides the light so that the light reaches the photosensitive sensor unit at a specific position. Depending on the varying distance of an object from the light incident surface of the sensor, the photosensitive sensor unit that has received the light from the object varies. Therefore, the distance between the object and the light incident surface of the sensor can be determined based the position of the photosensitive sensor unit that has received the light from the object. That is, coordinates of the object in the z direction can be determined.

In addition, coordinates of the object in the x-direction and in the y-direction can also be determined based on the position of the photosensitive sensor unit that has received the light from the object.

BRIEF DESCRIPTION OF THE DRAWINGS

The accompanying drawings constituting a part of the specification are provided for further understanding of the present disclosure and for explaining the present disclosure together with the following specific implementations, but not intended to limit the present disclosure. In the drawings.

DETAILED DESCRIPTION

Hereinafter, embodiments of the present disclosure will be described in detail with reference to the accompanying drawings. It should be understood that the embodiments are described herein only for the purpose of illustration and explanation and not intended to limit the present disclosure.

In the present disclosure, a sensor is applied in a three-dimensional space, a plane where a light incident surface of the sensor is located is a xy-plane, and z axis is perpendicular to the xy-plane.

Figure 1:
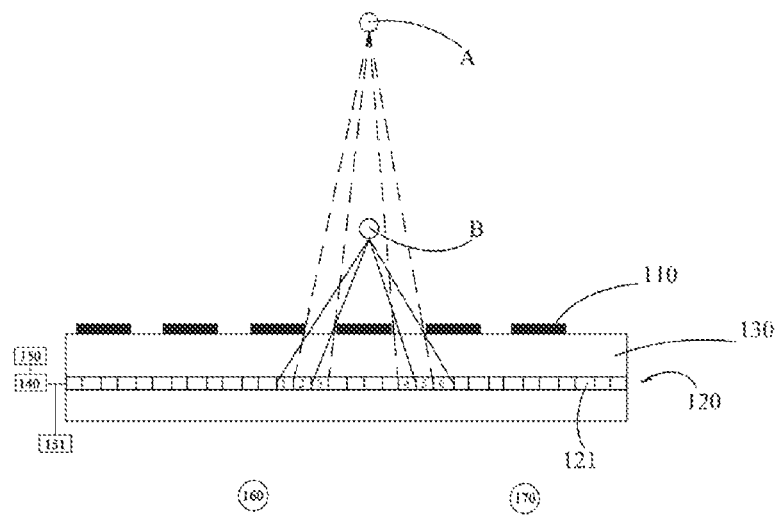
FIG. 1 is a schematic diagram of a structure of a sensor according to an embodiment of the present disclosure.

As an aspect of the present disclosure, there is provided a sensor. As shown in FIG. 1, the sensor includes a grating 110 and a sensor array 120 sequentially disposed in the thickness direction, that is, the updown direction in FIG. 1, of the sensor. The sensor array 120 includes a plurality of photosensitive sensor units 121, and light can pass through light transmission gaps of the grating 110 to reach the plurality of photosensitive sensor units 121.

When there is no object on a light incident side of the sensor, the light-sensing state of each photosensitive sensor unit 121 is predetermined. For example, when natural light is sensed by the photosensitive sensor units of the sensor, the photosensitive sensor unit 121 corresponding to the light transmission gap of the grating 110 is in a light-sensing state, and the photosensitive sensor unit 121 corresponding to the opaque region of the grating 110 is in a non light-sensing state.

When there is an object on the light incident side of the sensor, the light environment on the light incident side of the sensor becomes changed, and the object reflects the light toward the grating 110. Therefore, the sensor can detect whether there is an object on the light incident side of the sensor.

Since there is provided the grating 110 with the light transmission gaps, when the light from the object is irradiated toward the surface of the sensor provided with the grating, the shielding portion of the grating 110 guides the light so that the light reaches the photosensitive sensor unit 121 at a specific position. Depending on the varying distance of an object from the light incident surface of the sensor, the photosensitive sensor unit 121 that has received the light from the object varies. Therefore, the distance between the object and the light incident surface of the sensor can be determined based on the position of the photosensitive sensor unit 121 that has received the light from the object. That is, the coordinates of the object in the z direction can be determined.

In addition, the coordinates of the object in the x-direction and in the y-direction can also be determined based on the position of the photosensitive sensor unit 121 that has received the light from the object.

It can be seen from the above that the sensor provided according to the present discourse can determine the coordinates of an object in the three-dimensional space. When the sensor provided according to the present discourse is applied to a touch display device, three-dimensional control can be realized.

For ease of understanding, the operating principle of the sensor will now be described with reference to FIGS. 1 and 2.

As shown in FIG. 1, an object A and an object B are disposed on a light incident side of the sensor, and a distance between the object A and the light incident surface of the sensor is greater than a distance between the object B and the light incident surface of the sensor.

Figure 2:
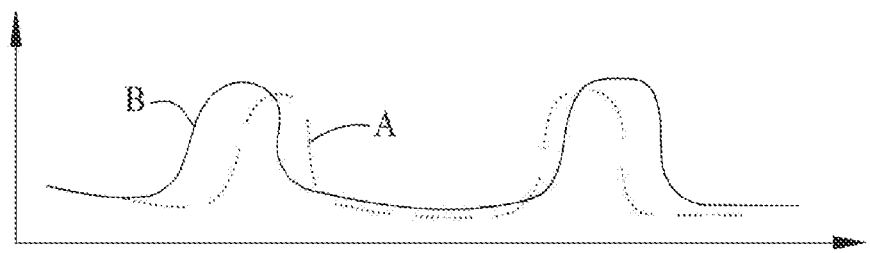
FIG. 2 is a schematic diagram illustrating a curve of the amount of light sensed by respective photosensitive sensor units of a sensor array when there is an object to be detected.

The two curves shown in FIG. 2 are curves of the amount of light sensed by the photosensitive sensor units of the sensor array when the object A exists on the light incident side and when the object B exists on the light incident side, respectively.

For the convenience of description, in the present discourse, the photosensitive sensor units 121 are numbered. Different numbers may indicate the coordinates of the object to be detected in the x and y directions.

In order to calculate the coordinates of the object to be detected on the light incident surface of the sensor, the sensor further includes a coordinate calculator 151 connected to the photosensitive sensor units. The coordinate calculator 151 may read the number of a photosensitive sensor unit 121, so as to calculate the coordinates of the object to be detected in x and y directions.

The light from the object A is guided via the light transmission gaps of the grating 110, and reaches the photosensitive sensor units numbered 2 and 3 and the photosensitive sensor units numbered 4 and 5. The light from the object B is guided via the light transmission gaps of the grating 110, and reaches the photosensitive sensor units numbered 1 and 2 and the photosensitive sensor units numbered 5 and 6.

For ease of arrangement, as shown in FIG. 1, the sensor includes a transparent substrate 130. The grating 110 is disposed on one side of the transparent substrate 130, and a sensor array 120 is disposed on the other side of the transparent substrate.

In order to calculate the distance between the object to be detected and the sensor, optionally, the sensor further includes a distance calculator 150 and a spectrum generator 140, as shown in FIG. 1. The spectrum generator 140 is connected to the sensor array 120, and the distance calculator 150 is connected to the spectrum generator 140. The spectrum generator 140 is configured to generate a curve of the amount of light sensed by each photosensitive sensor unit of the sensor array, as shown in FIG. 2, and the distance calculator 150 is configured to calculate a distance between the object to be detected and the sensor based on a width of the light transmission gap of the grating and a distance of two adjacent peaks of the curve of the amount of light sensed by the photosensitive sensor units.

In FIG. 2, the horizontal axis represents a position of a photosensitive sensor unit and the vertical axis represents the amount of light sensed by a photosensitive sensor unit. As shown in FIG. 2, the amount of light sensed by the photosensitive sensor unit(s) that has received the light reflected by the object to be detected is larger than the amount of light sensed by the photosensitive sensor unit(s) that has not received the light reflected by the object to be detected. Therefore, a peak of the curve is formed at the position of the photosensitive sensor unit(s) that has received the light reflected by the object to be detected.

A distance between two adjacent peaks refers to a distance between midpoints of respective widths of the two adjacent peaks.

In the present discourse, there is no particular limitation on the specific structure of the grating 110. For example, the grating 110 may include opaque grating strips which are spaced.

Figure 3:
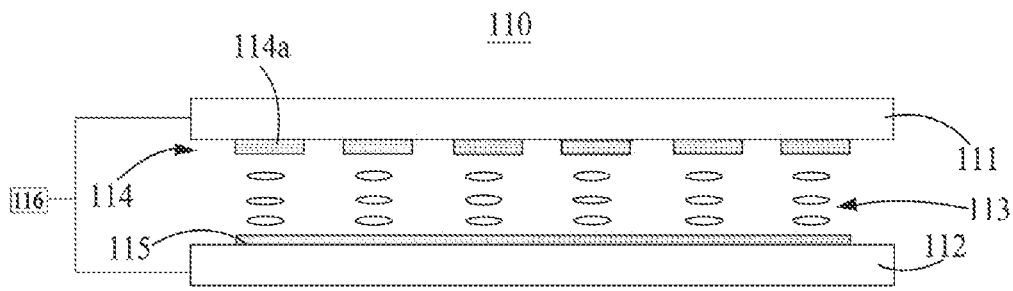
FIG. 3 is a schematic diagram of a structure of a grating.

In order to control opaque regions of the grating 110 to detect the distance accurately, according to an embodiment of the present discourse, the grating 110 may be a liquid crystal grating. As shown in FIG. 3, the grating 110 includes a first substrate 111 and a second substrate 112 which are arranged opposite to and aligned with each other, a liquid crystal material layer 113 filled between the first substrate 111 and the second substrate 112, a first transparent electrode layer 114, a second transparent electrode layer 115 and a controller 116. The first transparent electrode layer 114 is disposed on the first substrate 111, and the second transparent electrode layer 115 is disposed on the second substrate 112. The first transparent electrode layer 114 includes a plurality of first transparent electrodes 114a which are spaced. The controller 116 is connected to the first transparent electrode layer 114 and the second transparent electrode layer 115, and is configured to provide different control signals to the second transparent electrode layer 115 and part of the first transparent electrodes 114a of the first transparent electrode layer 114, respectively. When the first transparent electrodes 114a and the second transparent electrode layer 115 each receive different control signals, an electric field for deflecting liquid crystal molecules between the first transparent electrodes 114a and the second transparent electrode layer 115 can be formed between the first transparent electrodes 114a and the second transparent electrode layer 115, so as to form a plurality of spaced opaque regions in the liquid crystal material layer 113.

When liquid crystal molecules corresponding to a first transparent electrode 114a are deflected, a corresponding region is changed from transparency to opaque, thereby forming an opaque grating strip.

The sensor according to an embodiment of the present disclosure can be applied to a display panel. When an user wants to implement 3D touch control, he or she can choose to turn on the grating 110. When the user does not want to implement the 3D touch control, the controller 116 does not provide control signals to the first transparent electrode layer and the second transparent electrode layer, and therefore the entire liquid crystal material layer 113 is in a light transmission state.

In order to detect the distances of an object at different positions from the sensor surface accurately, optionally, the width of the light transmission gap of the grating may be adjustable. For this purpose, as a specific implementation, for example, the first transparent electrode 114a may be a strip electrode. The first transparent electrode 114a includes a plurality of transparent electrode strips arranged in a line and spaced apart from each other in the width direction of the first transparent electrode, and each of the transparent electrode strips can receive a control signal independently.

According to an embodiment of the present disclosure, there is no particular limitation on the specific structure of the first transparent electrode 114a, as long as the first transparent electrode layer 114 and the second transparent electrode layer 115 can form transparent regions and opaque regions, which are arranged alternately, after the first transparent electrode layer 114 and the second transparent electrode layer 115 respectively receive the corresponding control signals.

It can be seen from the above description and FIG. 1 that in a case where the width of the light transmission gap of the grating 110 is constant, the less the distance between the object to be detected and the light incident surface of the grating 110 is, the larger the distance between two adjacent peaks of the curve of the amount of light sensed by the photosensitive sensor units. Therefore, when the object to be detected is far enough from the grating 110, the distance between two adjacent peaks of the curve of the amount of light sensed by the photosensitive sensor units is sufficiently small (e.g. less than the best observation value).

In order to accurately detect the distance between the object to be detected and the light incident surface of the sensor, the light transmission gap of the grating may be adjustable. When the distance between the object to be detected and the sensor is relatively large, the light transmission gap of the grating 110 may be controlled to be wide. When the distance between the object to be detected and the sensor is relatively small, the light transmission gap of the grating 110 may be controlled to be narrow.

In order to make the light transmission gap of the grating 110 adjustable, optionally, the first transparent electrodes 114a are arranged in a plurality of rows and a plurality of columns on the first substrate. In other words, the first transparent electrodes 114a may be arranged in a matrix. For example, each of the first transparent electrodes 114a may be a rectangular block electrode. The first substrate may be divided into a plurality of grating units, each of which may be provided with a first transparent electrode 114a therein. By providing electrical signals to different first transparent electrodes 114a, the resulting grating 110 may have light transmission gaps with different widths.

Specifically, when the distance between two adjacent peaks of the curve of the amount of light sensed by the photosensitive sensor units is less than a first preset value, the controller changes the first transparent electrode that receives the control signal so that a distance between two adjacent opaque regions is increased than a previous state until the distance between the two adjacent peaks of the curve of the amount of light sensed by the photosensitive sensor units reaches the first preset value.

When the distance between two adjacent peaks of the curve of the amount of light sensed by the photosensitive sensor units is greater than a second preset value, the controller changes the first transparent electrode that receives the control signal so that a distance between two adjacent opaque regions is reduced than a previous state until the distance between the two adjacent peaks of the photosensitive amount curve reaches the second preset value.

The first preset value and the second preset value may be an upper limit and a lower limit of an optimal resolution range, respectively. Here, there is no special requirement on the first value and second preset value, as long as they can make the identifying of each peak easy. For example, the first preset value may be 1 mm. It should be noted that the first preset value and second preset value may be set according to the specific size of the display device. For example, the first preset value may be 3 to 5 times the width of the pixel unit in the display surface used together with the sensor.

According to an embodiment of the present disclosure, the so-called "previous state" means a state before the controller changes the first transparent electrode that receives the control signal.

Figure 4:
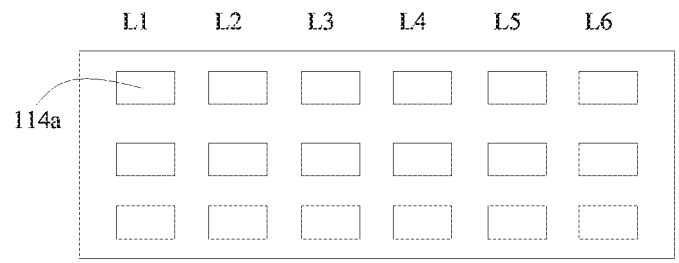
FIG. 4 is a schematic diagram of a first transparent electrode layer.

Hereinafter, it will be explained with reference to FIG. 4 how the controller changes the position of the first transparent electrode that receives the control signal.

The first transparent electrode layer includes first transparent electrodes 114a arranged in a plurality of columns. In a first state, a control signal may be provided to the first transparent electrodes in column L1, column L3 and column L5. If the distance between two adjacent peaks of the curve of the amount of light sensed by the photosensitive sensor units is less than the first preset value, a control signal may be provided to the first transparent electrodes in the column L1 and column L4, and so on. By doing so, the width of the light transmission gap of the resulting grating will be increased, and vice versa.

According to an embodiment of the present disclosure, there is no particular limitation on a size of the grating unit. In an embodiment, an area of one grating unit may be the same as that of a pixel unit of the display panel used together with the sensor.

According to an embodiment of the present disclosure, there is no particular limitation on the specific structure of the photosensitive sensor unit. For example, the photosensitive sensor unit may be used to sense visible light. In this case, optionally, the sensor further includes a visible light source 160 so as to improve the sensing accuracy. The visible light source 160 is disposed on a side of the sensor array facing away from the grating, as shown in FIG. 1. According to an embodiment of the present disclosure, there is no particular limitation on the specific structure of the visible light source 160. For example, the visible light source 160 may be an OLED light source.

When the sensor is used in a liquid crystal display device, the visible light source 160 may be a backlight source of the liquid crystal display device.

In order to avoid the influence of ambient light on the sensor and make the sensor more suitable for the touch display device, optionally, the photosensitive sensor unit is configured to sense infrared rays so as to better sense a finger of human body. Of course, the sensor according to an embodiment of the present disclosure is not limited to sense the finger of human body. The sensor can also track a position of the human eye based on the light reflected by the human eye, thereby providing a better display angle.

Human body can emit infrared. Accordingly, in order to improve detection accuracy, the sensor may further include an infrared light source 170, which is disposed on the side of the sensor array facing away from the grating, as shown in FIG. 1. When the sensor is used, the light emitted by the infrared light source 170 passes through the sensor array and the grating and is irradiated onto the object to be detected, and the object reflects the received infrared light to the grating.

Since infrared light belongs to invisible light, infrared light does not affect the display effect of the display device when the sensor is used in the display device.

Figure 5:
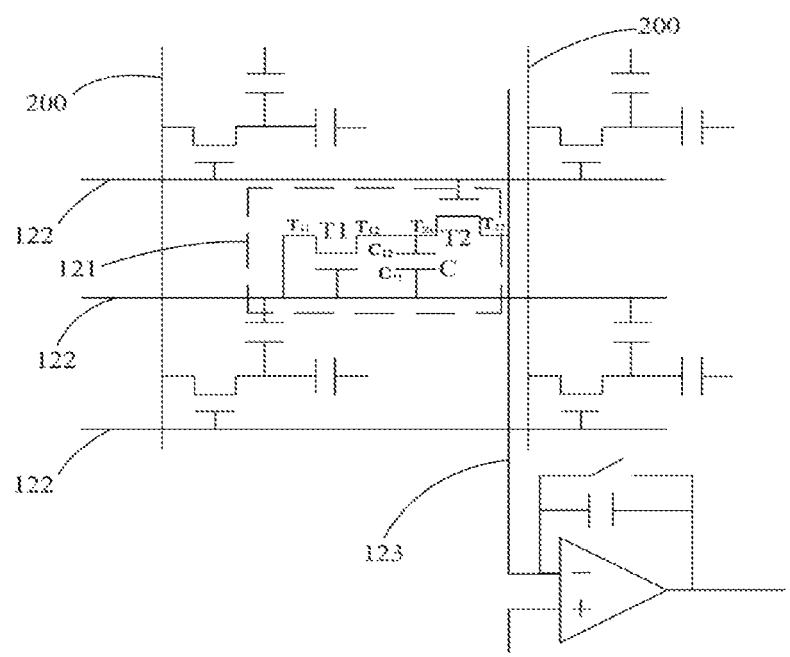
FIG. 5 is a circuit diagram of the display device according to an embodiment of the present disclosure.

In order to determine the coordinates of a touch point on the xy-plane, optionally, as shown in FIG. 5, the sensor array includes a plurality of touch driving lines 122 and a plurality of touch sensing lines 123. The plurality of touch driving lines 122 and the plurality of touch sensing lines 123 intersect with each other and define a plurality of sensing units. Each of the plurality of sensing units is provided with one photosensitive sensor unit 121. An input terminal of the photosensitive sensor unit 121 is connected to the touch driving line 122, and an output terminal of the photosensitive sensor unit 121 is connected to the touch sensing line 123.

It can be understood that the touch sensing lines 123 are configured to output signals output by the photosensitive sensor units 121. In order to determine a position of a touch point, optionally, signals may be provided to the touch driving lines 122 row by row. The signal output by the photosensitive sensor unit 121 is related to the signal provided by the touch driving line 122 and the optical signal received by the photosensitive sensor unit 121.

According to an embodiment of the present disclosure, there is no particular limitation on the specific structure of the photosensitive sensor unit 121. For example, the photosensitive sensor unit 121 may include a photosensitive diode. In the embodiment shown in FIG. 5, the photosensitive sensor unit 121 includes a phototransistor T1, an output transistor T2, and a capacitor C.

A first electrode T11 and a gate electrode of the phototransistor T1 and a first end C11 of the capacitor C are connected to the touch driving line 122 corresponding to the photosensitive sensor unit 121 in the current row; a second electrode T12 of the phototransistor T1 is connected to a second end C12 of the capacitor C and a first electrode T21 of the output transistor T2; a gate electrode of the output transistor T2 is connected to the touch driving line 122 corresponding to the photosensitive sensor unit 121 in the previous row; and a second electrode T22 of the output transistor T2 is connected to the touch sensing line 123 corresponding to the photosensitive sensor unit 121 in the current column.

The operating principle of the photosensitive sensor unit 121 will be described below.

Before the intensity of the external light is detected, the capacitor C is first charged to a preset voltage, so that the voltages of the capacitors are the same at the start of the detection. The magnitude of the leakage current that occurs when the phototransistor T1 is irradiated by external light can be calculated by a difference between the preset voltage and the voltage of the capacitor C read by an external reader. When the output transistor T2 is turned on, the voltage signal in the capacitor C may be output in a form of a current. After calculation of the magnitude of the leakage current due to the irradiation of the external light to the phototransistor T1, the coordinate(s) of the object can be determined based on the amount of light sensed by the phototransistor T1 in which the leakage current occurs and the position of the phototransistor T1 in which the leakage current occurs.

In order to reduce output noise, optionally, an active layer of the phototransistor T1 may be made of an amorphous silicon material and an active layer of the output transistor T2 may be made of an oxide material. This is because amorphous silicon reacts faster to visible wavelengths, while oxide thin film transistors may have smaller size. Therefore, in the case where the phototransistor T1 and the output transistor T2 are integrated in a pixel unit, a faster response speed and a larger aperture ratio can be obtained.

Figure 6:
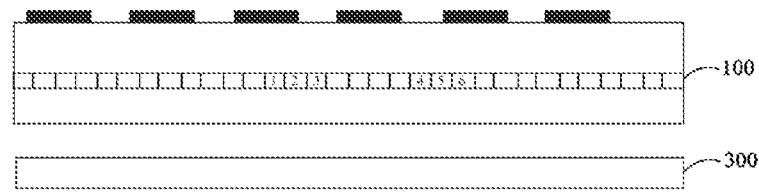
FIG. 6 is a schematic diagram of a structure of the display device.

As another aspect of the present disclosure, there is provided a display device including a display panel 300 and a sensor 100, as shown in FIG. 6, The sensor is the above sensor according to an embodiment of the present disclosure, and the surface of the grating facing away from the sensor array and the light-exiting surface of the display panel 300 are facing toward a same direction.

The sensor may be attached on the light-exiting surface of the display panel to form an on-cell touch display device. Alternatively, the sensor array may be integrated in the display panel.

As described above, since the sensor provided in the present discourse can detect the coordinates of an object in the three-dimensional space at the same time, the display device can realize a three-dimensional touch control.

According to an embodiment of the present, there is no particular limitation on the specific type of the display panel. For example, the display panel may be a liquid crystal panel. In the specific embodiment shown in FIG. 5, the display panel is a liquid crystal display panel.

In order to reduce a thickness of the display device, optionally, as shown in FIG. 5, when the sensor array includes a plurality of touch driving lines and a plurality of touch sensing lines, the touch driving lines also serve as gate lines of the display panel. The display device further includes data lines 200, which may be disposed in parallel with the touch sensing lines 123.

By adopting the sensor according to an embodiment of the present disclosure, the display device can realize not only the function of three-dimensional touch control but also the functions of fingerprint identification and the like.

It can be understood that the above embodiments are merely exemplary embodiments used for illustrating the principle of the present disclosure, but the present disclosure is not limited thereto. For those skilled in the art, various modifications and improvements may be made without departing from the spirit and essence of the present disclosure, and these variations and improvements are also considered as the protection scope of the present disclosure.

The invention claimed is:

1. A sensor, comprising a grating and a sensor array sequentially disposed in a thickness direction of the sensor,
   wherein the sensor array comprises a plurality of photosensitive sensor units, and light passing through a light transmission gap of the grating reaches the plurality of photosensitive sensor units,
   the sensor further comprises a spectrum generator configured to generate a curve of an amount of light sensed by the photosensitive sensor units in the sensor array in response to the amount of light sensed by the photosensitive sensor units when being subject to light reflected by an object to be detected,
   wherein the grating comprises a first substrate and a second substrate arranged opposite to and aligned with each other, a liquid crystal material layer filled between the first substrate and the second substrate, a first transparent electrode layer, a second transparent electrode layer and a controller,
   wherein the first transparent electrode layer is disposed on the first substrate, the second transparent electrode layer is disposed on the second substrate, and the first transparent electrode layer comprises a plurality of first transparent electrodes which are spaced,
   wherein the controller is configured to provide different control signals to the second transparent electrode layer and part of the first transparent electrodes of the first transparent electrode layer, respectively, and
   wherein when the first transparent electrodes and the second transparent electrode layer receive different control signals, respectively, an electric field for deflecting liquid crystal molecules is formed between the first transparent electrodes and the second transparent electrode layer, so as to form a plurality of spaced opaque regions in the liquid crystal material layer,
   in a case where a distance between two adjacent peaks of the curve of the amount of light sensed by the photosensitive sensor units is less than a first preset value, the controller is configured to chance the first transparent electrode receiving the control signal so that the distance between two adjacent opaque regions is larger than it was before until the distance between the two adjacent peaks of the curve of the amount of light sensed by the photosensitive sensor units reaches the first preset value, and
   in a case where a distance between two adjacent peaks of the curve of the amount of light sensed by the photosensitive sensor units is greater than a second preset value, the controller is configured to change the first transparent electrode receiving the control signal so that the distance between two adjacent opaque regions is smaller than it was before until the distance between the two adjacent peaks of the curve of the amount of light sensed by the photosensitive sensor units reaches the second preset value.

2. The sensor of claim 1, further comprising a coordinate calculator configured to determine a coordinate of the object on the light incident surface of the sensor based on the position of the photosensitive sensor unit that has received the light from the object.

3. The sensor of claim 1, further comprising a transparent substrate, wherein the grating is disposed on one side of the transparent substrate, and the sensor array is disposed on the other side of the transparent substrate.

4. The sensor of claim 1, wherein the first transparent electrode is a strip-shaped electrode, and the plurality of spaced opaque regions are provided as opaque grating strips of the grating.

5. The sensor of claim 1, wherein the plurality of the first transparent electrodes are arranged in a plurality of rows and a plurality of columns on the first substrate.

6. The sensor of claim 5, wherein the plurality of the first transparent electrodes are a plurality of rectangular electrodes arranged in a matrix on the first substrate.

7. The sensor of claim 5 wherein
the sensor array further comprises a plurality of touch driving lines and a plurality of touch sensing lines intersecting with each other and defining a plurality of sensing units, each of the sensing units being provided with one of the photosensitive sensor units which has an input terminal connected to the touch driving line and an output terminal connected to the touch sensing line.

8. The sensor of claim 7, wherein each of the photosensitive sensor units comprises a phototransistor, an output transistor and a capacitor, a first electrode and a gate electrode of the phototransistor and a first end of the capacitor being connected to the touch driving line corresponding to the photosensitive sensor units in a current row, a second electrode of the phototransistor being connected to a second end of the capacitor and a first electrode of the output transistor, a gate electrode of the output transistor being connected to the touch driving line corresponding to the photosensitive sensor units in a previous row, and a second electrode of the output transistor being connected to the touch sensing line corresponding to the photosensitive sensor units in a current column.

9. The sensor of claim 8, wherein the coordinates of the object are determined based on the amount of light sensed by the phototransistor in which leakage current occur due to irradiation of external light and a position of the phototransistor.

10. The sensor of claim 8, wherein an active layer of the phototransistor is made of an amorphous silicon material, and an active layer of the output transistor is made of an oxide.

11. The sensor of claim 1, wherein
each of the photosensitive sensor units is configured to sense visible light, and the sensor further comprises a visible light source disposed on a side of the sensor array facing away from the grating.

12. The sensor of claim 1, wherein
each of the photosensitive sensor units is configured to sense infrared light, and the sensor further comprises an infrared light source disposed on a side of the sensor array facing away from the grating.

13. A display device, comprising a display panel and a sensor, wherein the sensor is the sensor according to claim 1, and a surface of the grating facing away from the sensor array and a light-exiting surface of the display panel are facing toward a same direction.

14. The display device of claim 13, wherein in a case where the sensor array comprises a plurality of touch driving lines and a plurality of touch sensing lines, the touch driving lines further serve as gate lines of the display panel.

\* \* \* \* \*